US012604509B2

(12) United States Patent
Tadepalli et al.

(10) Patent No.: US 12,604,509 B2
(45) Date of Patent: Apr. 14, 2026

(54) HIGH VOLTAGE TRANSISTOR WITH A FIELD PLATE

(71) Applicant: Texas Instruments Incorporated, Dallas, TX (US)

(72) Inventors: Ramana Tadepalli, McKinney, TX (US); Chang Soo Suh, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 887 days.

(21) Appl. No.: 17/700,147

(22) Filed: Mar. 21, 2022

(65) Prior Publication Data

US 2022/0216309 A1    Jul. 7, 2022

Related U.S. Application Data

(62) Division of application No. 16/444,936, filed on Jun. 18, 2019, now Pat. No. 11,302,785.

(51) Int. Cl.
H10D 64/00 (2025.01)
G01R 31/26 (2020.01)
(Continued)

(52) U.S. Cl.
CPC ....... H10D 64/112 (2025.01); G01R 31/2601 (2013.01); G01R 31/2621 (2013.01); H01L 21/76838 (2013.01); H01L 22/20 (2013.01); H01L 23/3107 (2013.01); H01L 23/528 (2013.01); H01L 24/05 (2013.01); H01L 24/17 (2013.01); H01L 24/48 (2013.01);
(Continued)

(58) Field of Classification Search
CPC ............... H10D 64/112; H10D 30/601; H10D 30/4755; G01R 31/2601

USPC .......................................................... 438/286
See application file for complete search history.

(56) References Cited

U.S. PATENT DOCUMENTS 8,362,785 B2    1/2013    Tamegaya
9,476,933 B2    10/2016    Joh et al.
(Continued)

FOREIGN PATENT DOCUMENTS

WO        2019066878        4/2019

OTHER PUBLICATIONS

Colina et.al.,"Fundamentals of Gallium Nitride Power Transistors," Application Note No. AN002, 2011, EPC—Efficient Power Conversion Corporation', accessed Jun. 18, 2019 from https://epc-co.com/epc/Portals/0/epc/documents/product-training/appnote_ganfundamentals.pdf on Jun. 18, 2019.
(Continued)

*Primary Examiner* — Jami Valentine Miller
(74) *Attorney, Agent, or Firm* — Ronald O. Neerings; Frank D. Cimino

(57)        ABSTRACT

In a described example, an apparatus includes a transistor formed on a semiconductor substrate, the transistor including: a transistor gate and an extended drain between the transistor gate and a transistor drain contact; a transistor source contact coupled to a source contact probe pad; a first dielectric layer covering the semiconductor substrate and the transistor gate; a source field plate on the first dielectric layer and coupled to a source field plate probe pad spaced from and electrically isolated from the source contact probe pad; and the source field plate capacitively coupled through the first dielectric layer to a first portion of the extended drain.

20 Claims, 18 Drawing Sheets

(51) Int. Cl.

| | |
|---|---|
| *H01L 21/66* | (2006.01) |
| *H01L 21/768* | (2006.01) |
| *H01L 23/00* | (2006.01) |
| *H01L 23/31* | (2006.01) |
| *H01L 23/528* | (2006.01) |
| *H10D 30/47* | (2025.01) |
| *H10D 30/60* | (2025.01) |
| *H10D 62/80* | (2025.01) |
| *H10D 62/85* | (2025.01) |

(52) U.S. Cl.

CPC ......... *H01L 24/49* (2013.01); *H10D 30/4755* (2025.01); *H10D 30/601* (2025.01); *H01L 2224/05548* (2013.01); *H01L 2224/17106* (2013.01); *H01L 2224/48132* (2013.01); *H01L 2224/48175* (2013.01); *H01L 2224/49113* (2013.01); *H10D 62/80* (2025.01); *H10D 62/8503* (2025.01)

(56) References Cited

U.S. PATENT DOCUMENTS

| | | | | |
|---|---|---|---|---|
| 10,461,161 | B1 * | 10/2019 | Kinzer | ............... H10D 62/8503 |
| 2004/0212388 | A1 * | 10/2004 | Baumann | ................. G21K 5/02 |
| | | | | 324/762.01 |
| 2013/0248979 | A1 | 9/2013 | Ono et al. | |
| 2014/0042452 | A1 | 2/2014 | Pendharkar et al. | |
| 2014/0042535 | A1 * | 2/2014 | Darwish | ........... H01L 21/26506 |
| | | | | 257/334 |
| 2016/0064310 | A1 | 3/2016 | Sirinoarakul et al. | |
| 2016/0148681 | A1 | 5/2016 | Bukethal | |
| 2017/0018617 | A1 * | 1/2017 | Xia | .................... H10D 30/6738 |
| 2017/0020081 | A1 | 1/2017 | Zimmerman et al. | |
| 2017/0200794 | A1 | 7/2017 | Huang et al. | |
| 2018/0308773 | A1 | 10/2018 | Lee et al. | |
| 2019/0081141 | A1 | 3/2019 | Mizan et al. | |
| 2019/0097001 | A1 | 3/2019 | LaRoche et al. | |
| 2025/0212442 | A1 * | 6/2025 | Haynie | ............... H10D 84/834 |

OTHER PUBLICATIONS

Barbarini et. al., "Texas Instruments LMG3410 600V GaN FET Power Stage, Reverse Costing & Technology Analysis Report," SP17331_Flyer, SystemPlus Consulting, Jul. 2017, accessed 2019-06018 at https://yole-i-micronews-com.osu.eu-west-2.outscale.com/uploads/2019/02/Yole_Texas_Instruments_LMG3410_600V_GaN_FET_Power_Stage_Flyer_System_Plus_Consulting_SP17331_flyer.pdf on Jun. 18, 2019.

Gazmer, J., "Texas Instruments Announces New Portfolio of Ready-to-Use GaN FET power Devices," web post, BISinfotech, Oct. 30, 2018, accessed Jun. 18, 2019 at https://www.bisinfotech.com/semiconductor-component/power-electronics/texas-instruments-announces-ready-to-use-gan-fet-power-devices/.

EPO Search Report Application No. 20826127.1-1212/3987566 PCT/US2020037701, mailed Jul. 29, 2022, 12 pages.

* cited by examiner

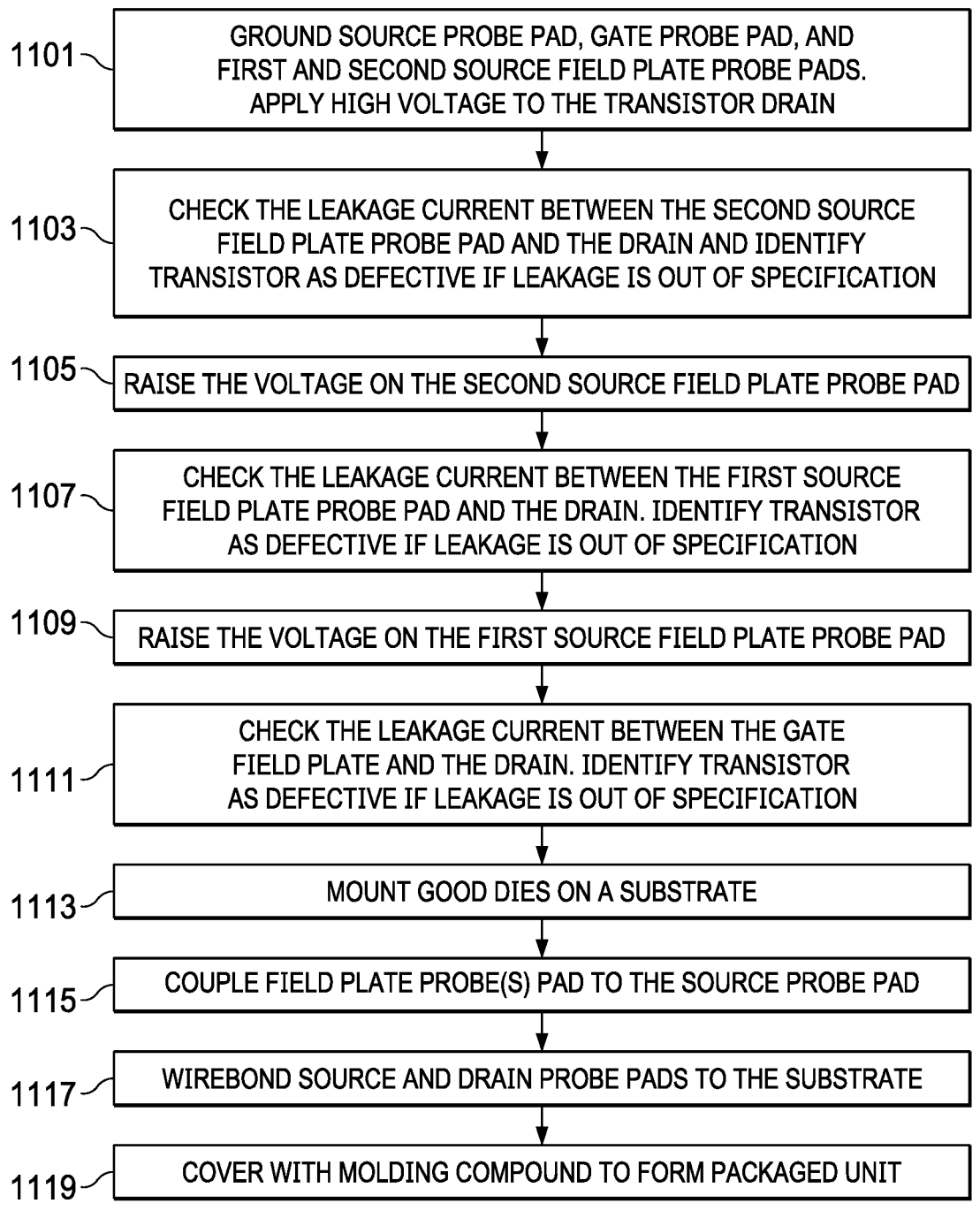

1101 — GROUND SOURCE PROBE PAD, GATE PROBE PAD, AND FIRST AND SECOND SOURCE FIELD PLATE PROBE PADS. APPLY HIGH VOLTAGE TO THE TRANSISTOR DRAIN

1103 — CHECK THE LEAKAGE CURRENT BETWEEN THE SECOND SOURCE FIELD PLATE PROBE PAD AND THE DRAIN AND IDENTIFY TRANSISTOR AS DEFECTIVE IF LEAKAGE IS OUT OF SPECIFICATION

1105 — RAISE THE VOLTAGE ON THE SECOND SOURCE FIELD PLATE PROBE PAD

1107 — CHECK THE LEAKAGE CURRENT BETWEEN THE FIRST SOURCE FIELD PLATE PROBE PAD AND THE DRAIN. IDENTIFY TRANSISTOR AS DEFECTIVE IF LEAKAGE IS OUT OF SPECIFICATION

1109 — RAISE THE VOLTAGE ON THE FIRST SOURCE FIELD PLATE PROBE PAD

1111 — CHECK THE LEAKAGE CURRENT BETWEEN THE GATE FIELD PLATE AND THE DRAIN. IDENTIFY TRANSISTOR AS DEFECTIVE IF LEAKAGE IS OUT OF SPECIFICATION

1113 — MOUNT GOOD DIES ON A SUBSTRATE

1115 — COUPLE FIELD PLATE PROBE(S) PAD TO THE SOURCE PROBE PAD

1117 — WIREBOND SOURCE AND DRAIN PROBE PADS TO THE SUBSTRATE

1119 — COVER WITH MOLDING COMPOUND TO FORM PACKAGED UNIT

FIG. 11

HIGH VOLTAGE TRANSISTOR WITH A FIELD PLATE

This application is a Divisional of application Ser. No. 16/444,936 filed Jun. 18, 2019.

TECHNICAL FIELD

This disclosure relates generally to high voltage transistors, and more particularly to high voltage transistors with a field plate.

SUMMARY

In a described example, an apparatus includes a transistor formed on a semiconductor substrate, the transistor including: a transistor gate and an extended drain between the transistor gate and a transistor drain contact; a transistor source contact coupled to a source contact probe pad; a first dielectric layer covering the substrate and the transistor gate; a source field plate on the first dielectric layer and coupled to a source field plate probe pad spaced from and electrically isolated from the source contact probe pad; and the source field plate capacitively coupled through the first dielectric layer to a first portion of the extended drain.

BRIEF DESCRIPTION OF THE DRAWINGS

FIG. 11 is a flow diagram listing the steps for testing and packaging a high voltage, extended drain transistor with electrically independent source probe pad and with source field plate probe pads.

DETAILED DESCRIPTION

Figure 1:
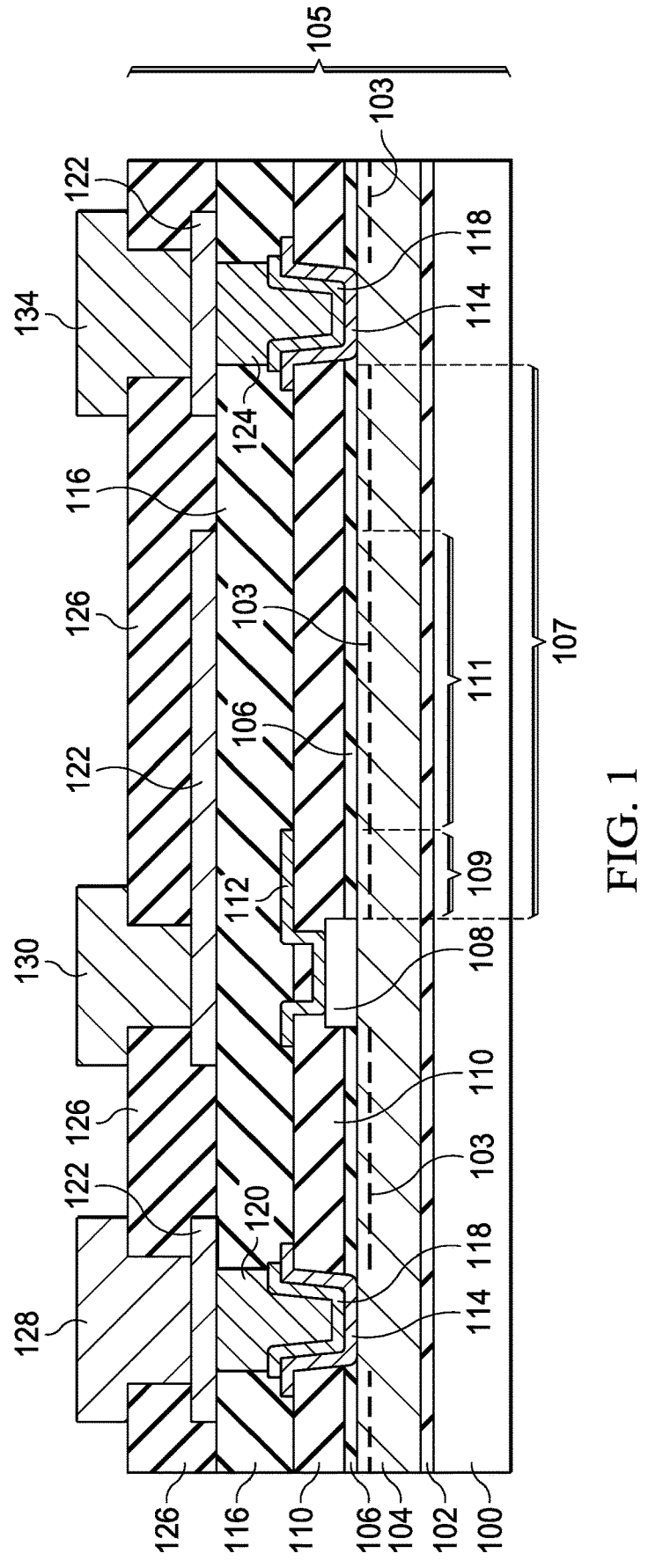
FIG. 1 is a cross sectional view of a high voltage, high electron mobility transistor (hv-HEMT) with a gate field plate, a source field plate and with separate probe pads for the transistor source and the source field plate.

Corresponding numerals and symbols in the different figures generally refer to corresponding parts, unless otherwise indicated. The figures are not necessarily drawn to scale.

In this description, layers are described as formed "on" an underlying layer. However, intervening layers can be used. For example, a conductor metal can be formed on a dielectric layer that is referred to as "inter-metal dielectric" or "IMD." The term "on" includes alternatives where the metal is deposited directly upon the inter-metal dielectric (IMD) layer, and alternatives where the metal is deposited on an intervening layer such as an anti-reflective coating (ARC) layer, a backside anti-reflective coating (BARC) layer, an adhesion layer, or a diffusion barrier layer; these intervening layers improve results including improving photolithography results, reducing delamination, and reducing diffusion of atoms into surrounding materials. Whether or not such intervening layers are present, the conductor layer is referred to as "on" or "over" the dielectric layer herein.

Several layers described in the arrangements are dielectric layers. Examples include pre-metal dielectric (PMD) layers, and inter-metal dielectric (IMD) layers, sometimes referred to as "inter-level dielectric" layers (ILD). While these layers are described as single layers in the examples, the arrangements include multilayer dielectric layers as well. Materials for dielectric layers useful with the arrangements include silicon dioxide or simply "oxide," silicon nitride or simply "nitride," silicon oxynitride, silicon carbide, and other dielectrics used for semiconductor devices. Various processes for deposition of dielectric films can be used with the arrangements, including chemical vapor deposition (CVD), plasma enhanced chemical vapor deposition (PECVD), molecular beam epitaxy (MBE), and others. Several layers are described herein as "metal layers" or "conductor layers." These metal or conductor layers can be, for example, aluminum or aluminum alloys, copper or copper alloys, and can include additional platings such as nickel, palladium, gold, silver, platinum, tungsten, titanium and combinations of these. Sputtering and damascene processes can be used with pattern and etch to form the metal layers. Electroplating and electroless plating can be used to form the metal layers. Chemical-mechanical polishing (CMP) can be used to form the metal layers.

In this description, the term "via" is used. As used herein, a via is a connection formed between metal layers that are spaced apart by a dielectric layer. The via includes an opening in the dielectric layer and a conductive material in the opening, such as a conductive plug, or plated material, filling the opening or forming a conductive lining in the opening, to electrically connect the metal layers through the dielectric layer.

In this description, the term "contact" is used. As used herein, a contact is an area where a conductive material electrically and physically contacts a region in a semiconductor substrate. The contact makes an electrical connection, for example, between a conductor layer and a source, body or drain region.

In this description, the term "high voltage transistor" is used. As used herein, the term high voltage transistor means a transistor operating to supply voltages greater than 20 Volts. The arrangements are useful with transistors where a source field plate or more than one source field plate is used. High voltage transistors often use source field plates.

In this description, the term "wide bandgap semiconductor substrate" is used. As used herein, a wide bandgap semiconductor substrate is one of a material with a bandgap voltage in the range of 2-4 electron volts (eV). Example materials include III-V and II-VI compounds. Gallium nitride (GaN), aluminum gallium nitride (AlGaN), aluminum nitride (AlN), and boron nitride, are example materials. In the examples a GaN layer is used as a semiconductor substrate. The GaN layer can be an epitaxial layer on an insulator or on another semiconductor substrate. In another arrangement, $Ga_2O_3$ (gallium trioxide) can be used.

In example arrangements, a number of metal layers is shown. The number of metal layers used is process dependent and can be greater than the examples shown here, or less than the examples shown here. Semiconductor processes can include eight or more levels of metal, although fewer are typically used.

Transistors with low voltage gate dielectrics are used to switch high voltages in extended drain transistors. For example, a transistor with a gate dielectric that breaks down at 5 volts or less can be used to switch as many as several hundred volts in a high voltage, extended drain transistor. The voltage drop across the extended drain region between the drain contact and the low voltage transistor gate is enough to protect the low voltage gate dielectric from the high voltage applied to the drain contact. The length of the extended drain region needed for this transistor can be reduced by forming a field plate of conductive material over the drain region. For example, one of the overlying interconnect layers can be used. The field plate is coupled to the source contact and held at ground when the high voltage transistor is turned off. The grounded source field plate capacitively couples through a dielectric layer to the extended drain region, reducing the surface potential of the extended drain.

In the arrangements, the problem of testing devices with a source and source field plates is solved by using a probe pad provided to a source field plate in the devices and using another probe pad to a source of the devices, to enable overvoltage stress test (OVST) of the devices at wafer probe testing. The arrangements enable testing of the dielectric layers during wafer probe testing and before a die is packaged, saving costs and time that would otherwise be spent on packaging bad dies. When the device is packaged, the source and source field plates are electrically coupled together for use as a single terminal in normal operations.

FIG. 1 illustrates an enhancement mode, GaN high voltage (hv), high electron mobility transistor (hv-HEMT) with a gate field plate 112 and with a source field plate 122. The source field plate 122 is coupled to a source field plate probe pad 130 that is separate from the source probe pad 128, to improve testability. A GaN hv-HEMT 105 is used for the example in the illustration. Hv-HEMTs using alternative high mobility substrates, such as gallium trioxide ($Ga_2O_3$), can also be used. Drain extended MOS transistors (DEMOS) with field plates can be used with the arrangements as is further described hereinbelow. Either enhancement mode or depletion mode transistors can be used with the arrangements.

The ability to separately control the voltage on the source and the source field plates of the high voltage, extended drain transistor enables testing dielectrics in the transistors at wafer probe test, so that defective dielectrics can be detected and these devices can be scrapped at wafer probe test. This ability to identify failing devices at wafer probe test avoids the expense of packaging both good and bad dies, and reduces or eliminates the need for performing burn in test on the dies to then identify which packaged dies have a defective dielectric and should be scrapped. Because the packaging steps are costly, scrapping a packaged device is far more expensive and wasteful than identifying defective dies at wafer probe testing.

The substrate of the example hv-HEMT 105 in FIG. 1 is gallium nitride (GaN) 104 on an aluminum nitride insulator (AlN) 102 formed on a silicon substrate 100. An electron generating layer of aluminum, gallium and nitride (AlGaN) 106 overlies portions of the gallium nitride layer 104 and generates a two dimensional electron gas in the GaN 104 layer (shown as a dashed line 103 in FIG. 1). Other wide bandgap semiconductor substrates can be used with the arrangements. Drain extended devices formed on silicon substrates can also be used with the arrangements. A gate 108 over a channel between the source contact 120 and drain contact 124 forms an enhancement mode hv-HEMT. The extended drain region 107 between the gate 108 and the high voltage drain contact 124 is long enough to drop sufficient voltage to protect transistor gate 108. A pre-metal dielectric (PMD) layer 110 covers the GaN substrate 104 and the gate 108. A gate field plate 112 on or over the PMD layer 110 covers the gate 108 and covers a first portion of the extended drain region 109 adjacent to the gate 108. The gate field plate can be made of a first layer of interconnect. The gate field plate 112 is coupled to the gate 108 by a contact through the PMD layer 110. A first inter-metal dielectric (IMD1) layer 116 covers the PMD layer 110 and the gate field plate 112.

A source field plate 122 on the first inter-metal dielectric (IMD1) layer 116 partially covers a second portion of the extended drain region 111 between the end of the gate field plate 112 and the end of the source field plate 122. The source field plate 122 can be made of a second layer of interconnect. A second IMD layer (IMD2) covers the IMD1 layer and covers the source field plate 122. A source field plate probe pad 130 on IMD2 layer 126 is connected to the source field plate 122 by a via through the IMD2 layer. A source probe pad 128 on IMD2 layer 126 connects to the source contact 120 by multiple vias that extend through IMD2 layer 126, IMD1 layer 116, and PMD layer 110. A drain probe pad 134 on IMD2 layer 126 is connected to the drain 124 by multiple vias that extend through IMD2 layer 126, IMD1 layer 116, and PMD layer 110. A contact liner metal 114 such as TiN or TiW at the bottom of the source 120 and drain 124 contacts forms an ohmic connection to the underlying GaN substrate 104.

In operation, when a sufficient positive potential is placed at the gate 108 relative to the potential of source contact 120, a conductive channel region forms beneath the gate 108, and current conduction can occur between the drain and source. When the gate potential is removed, the electron gas layer disperses from beneath the gate 108, and conduction between the drain and source is blocked.

When the hv-HEMT is turned off, the source contact 120 and the source field plate 122 may be grounded. Capacitive coupling through the PMD layer between the grounded source field plate 122 and the extended drain region 107 reduces the surface potential of the extended drain region. The use of field plates enables higher voltage operation for a given device size (compared to devices without the source field plates) without losses that would otherwise occur due to current collapse. The coupling length between the gate field plate 112 and the first extended drain region 109, and the coupling length between the source field plate 122 and the second extended drain region 111, depends upon of the magnitude of the high voltage being switched by the hv-HEMT 105 and upon the breakdown voltage of the gate dielectric under the transistor gate 108.

Individual control of the voltage on the source field plate 122 and of the voltage on source contact 120 makes it possible to detect defective PMD layer 110 and defective IMD1 layer 116 dielectrics at wafer probe test. Defect detection at wafer probe test eliminates the need to package defective units along with good units, and then to later perform burn in testing to identify which packaged units are bad. By not packaging bad dies, substantial savings in materials, costs and time are achieved by use of the arrangements.

In the off state of the hv-HEMT 105, the source contact 120, the source field plate 122, the gate 108, and the gate field plate 112 can be grounded. When high voltage is applied to the hv-HEMT drain contact 124, the highest electric field is through the dielectric stack (IMD1 layer 116/PMD layer 110) between grounded source field plate 122 and the second extended drain region 111 underlying the grounded source field plate 122. If there is a defect in this dielectric stack either the leakage current from the source field plate 122 to the drain contact 124 is increased, or the dielectric stack breaks down. These changes in device operation can be observed during wafer probe test, indicating a defective device. Defective dies can be identified at wafer probe test and can be scrapped.

In the arrangements, providing a separate probe pad 130 for the source field plate 122 allows the voltage on the source field plate 122 to be raised while keeping the voltage on the source contact 120 at ground. Without separate control of the voltage on the source field plate 122 and the source contact 120, hv-HEMTs 105 with defective PMD layer 110 cannot be identified at wafer probe test. Raising the voltage on the source field plate 122 reduces the field in the underlying dielectric stack (IMD1 layer 116/PMD layer 110) allowing the potential on the first extended drain region 109 under the gate field plate 112 to rise. This raises the voltage between the extended drain region and the gate field plate 112, stressing the PMD layer 110 layer. Devices with defects in the PMD layer 110 under the gate field plate 112 can be identified in this manner at wafer probe test and can be scrapped.

Figure 2:
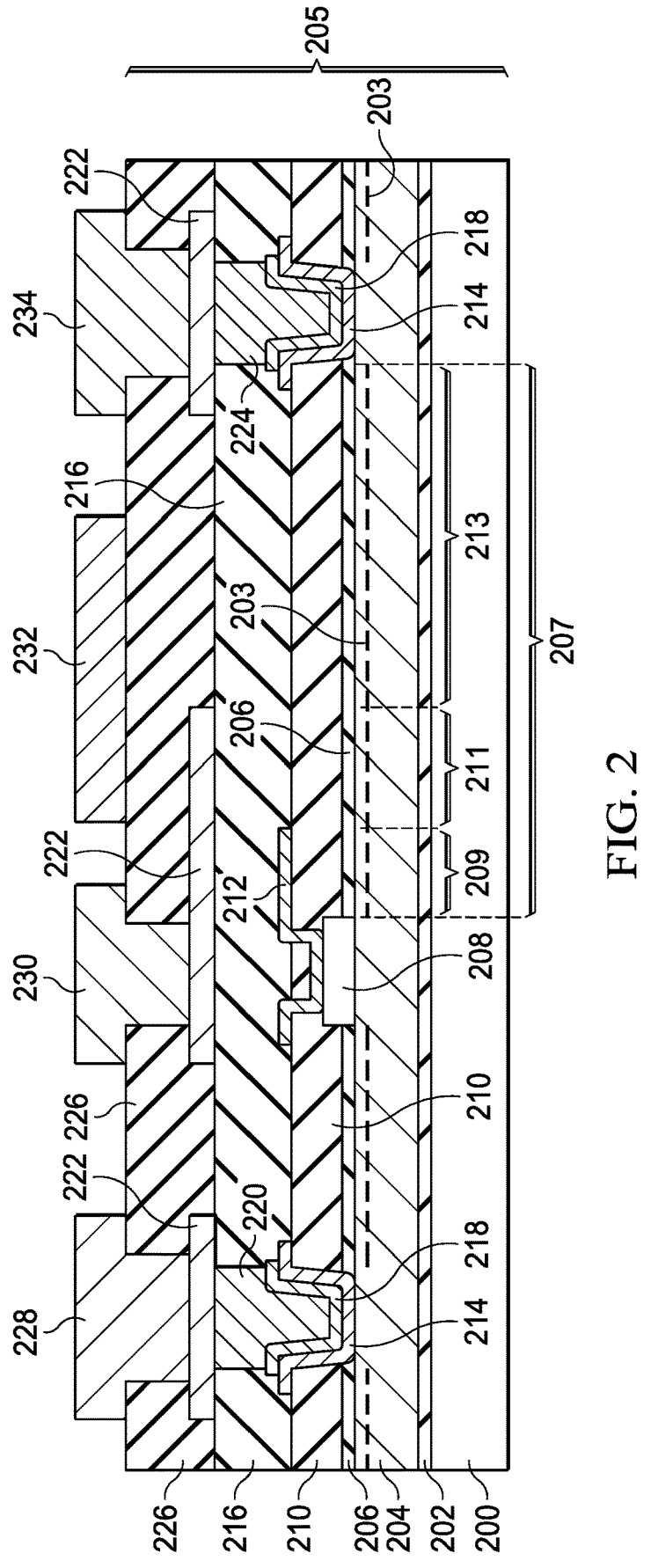
FIG. 2 is a cross sectional view of a hv-HEMT with a gate field plate, a first source field plate and a second source field plate with separate probe pads for the transistor source, the first source field plate, and the second source field plate.

FIG. 2 illustrates another hv-HEMT 205 in which the source field plate is segmented into a first source field plate 222 and a second source field plate 232. The addition of the second source field plate 232 enables the hv-HEMT 205 to switch a higher voltage (when compared to a device without the second source field plate) with little to no increase in the length of the extended drain. In FIG. 2 similar reference labels are used for similar elements as are shown in FIG. 1, for clarity. (For example, gate field plate 212 in FIG. 2 corresponds to gate field plate 112 in FIG. 1.) The hv-HEMT 205 in FIG. 2 is similar to the hv-HEMT 105 in FIG. 1, except that the length of the source field plate (compare 122 in FIG. 1) is decreased (when compared with the arrangement of FIG. 1) when forming the first source field plate 222, and a second source field plate 232 is now added over the IMD2 layer 226. The second source field plate 232 covers the end of the first source field plate 222 and covers a third portion of the extended drain region 213 that lies between the end of the first source field plate 222 and the high voltage drain contact 224. The second source field plate 232 is capacitively coupled to the third extended drain region 213 through the dielectric stack including IMD2 layer 226/IMD1 layer 216/PMD layer 210.

When the hv-HEMT 205 is off, the source contact 220, the first source field plate 222, and the second source field plate 232 can be held at ground. Since the dielectric stack (IMD2 layer 226/IMD1 layer 216/PMD layer 210) under the second source field plate 232 is thicker than the dielectric stack under the first source field plate (IMD1 layer 216/PMD layer 210), there is less capacitive coupling causing the surface potential of the third extended drain region 213 under the second source field plate 232 to be higher than the surface potential of the second extended drain region 211 under the first source field plate 222. When high voltage is applied to the hv-HEMT drain contact 224, the largest electric field is through the dielectric stack (IMD2 layer 226/IMD1 layer 216/PMD layer 210) between the grounded second source field plate 232 and the third extended drain region 213. If there is a defect in this dielectric stack which either increases leakage current through the dielectric stack or causes breakdown of this dielectric stack, it can be detected at wafer probe test and defective chips can be scrapped.

In this arrangement, use of the separate probe pads including source probe pad 228, first source field plate probe pad 230, and second source field plate 232 for the source 220, the first source field plate 222, and the second source field plate 232, respectively, allow the voltages on the source 230, the first source field plate 222 and the second source field plate 232 to be individually controlled. Without separate control of the voltages on the first source field plate 222 and the second source field plate 232 as provided by use of the arrangements, it cannot be determined at wafer probe test whether the dielectric PMD 210 between the gate field plate 212 and the underlying first extended drain region 209 is defective, or if the dielectric stack (IMD1 216/PMD 210) between the first source field plate 222 and the underlying second extended drain region 211 is defective. During wafer probe test, after it is determined that the dielectric stack (IMD2 layer 226/IMD1 layer 216/PMD layer 210) under the second field plate 232 passes parametric tests, the voltage can be first raised on the second source field plate 232 allowing high voltage to reach and stress the dielectric stack (IMD1 layer 216/PMD layer 210) under the first source field plate 222, and can second be raised on both the second source field plate 232 and the first source field plate 222, allowing high voltage to reach and stress the PMD layer 210 under the gate field plate 212. This enables high voltage transistors with dielectric defects in the PMD layer 210 under the gate field plate 212 and/or dielectric defects in the dielectric stack (IMD1 layer 216/PMD layer 210) under the first source field plate 222 to be detected and scrapped at probe.

Figure 3A:
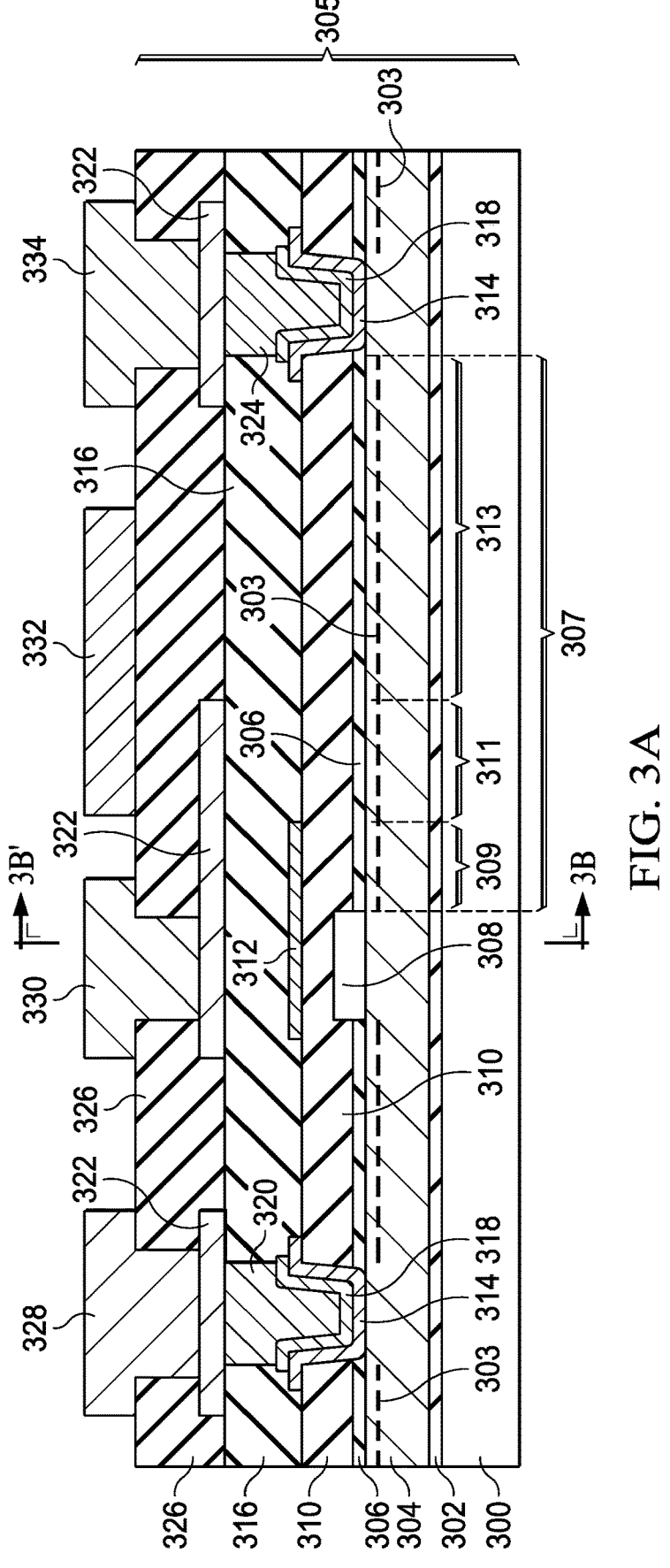
FIGS. 3A and 3B are cross sectional views of an hv-HEMT with a gate field plate that is isolated from the transistor gate.
Figure 3B:
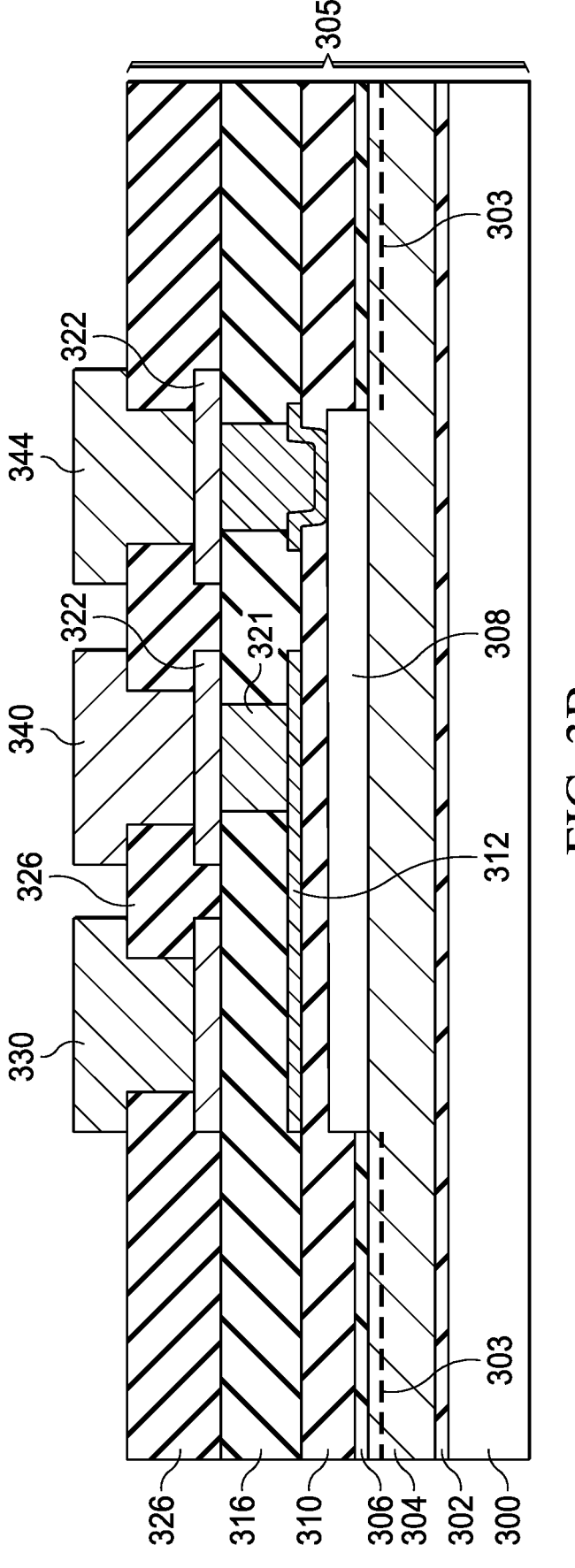

FIGS. 3A and 3B illustrate an alternative arrangement. In FIGS. 3A and 3B similar reference labels are used for similar elements as are shown in FIG. 2, for clarity of explanation. For example, gate field plate 312 in FIG. 3 corresponds to gate field plate 212 in FIG. 2. The hv-HEMT 305 in FIG. 3A is similar to the hv-HEMT 205 in FIG. 2 except that the gate field plate 312 in FIG. 3A is electrically isolated from the gate 308 by PMD layer 310. This enables the dielectric under the gate 308 to be stressed independently of the PMD layer 310 under the gate field plate 312. As shown in FIG. 3B, the gate field plate 312 is coupled to a gate field plate probe pad 340 on IMD2 layer 326, allowing independent control of voltage on the gate field plate 312. Source contact 320 is shown corresponding to source contact 220 in FIG. 2. Drain contact 324 is shown corresponding to drain contact 224 in FIG. 2. In FIG. 3A, the extended drain region 307 between the gate 308 and the drain contact 324, the first portion of the extended drain region 309 underlying the gate field plate 312, the second portion of the extended drain region 311 lies beneath the first source field plate 322, and the third portion of the extended drain region 313 lies beneath the second source field plate 332.

FIG. 3B is a cross section taken through the length of the gate electrode 308 along dashed line 3B-3B' in FIG. 3A. Gate field plate 312 is electrically isolated from the gate 308 by PMD layer 310. Dielectric stack IMD1 layer 316/IMD2 layer 326 overlies the gate field plate 312. A via 321 through IMD1 layer 316 connects the gate field plate 312 to an interconnect lead 322 on IMD1 layer 316. A via 323 through IMD2 layer 326 connects interconnect lead 322 to a probe pad 340 on IMD2 layer 326. A separate stack of a contact and vias connects the gate 308 to a separate probe pad 344 over IMD2 layer 326. Separate probe pads, 340 and 344, for the gate field plate 312 and the gate 308, respectively allows the voltage on gate 308 and gate field plate 312 to be independently controlled. This enables the gate dielectric under the gate 308 and the PMD dielectric 310 under the gate field plate 312 to be stressed independently during wafer probe test. The gate field probe pad 340 for the gate field plate 312 and the gate probe pad 344 for the gate 308 are coupled together prior to or during packaging of the hv-HEMT, as is further described hereinbelow.

Figure 4:
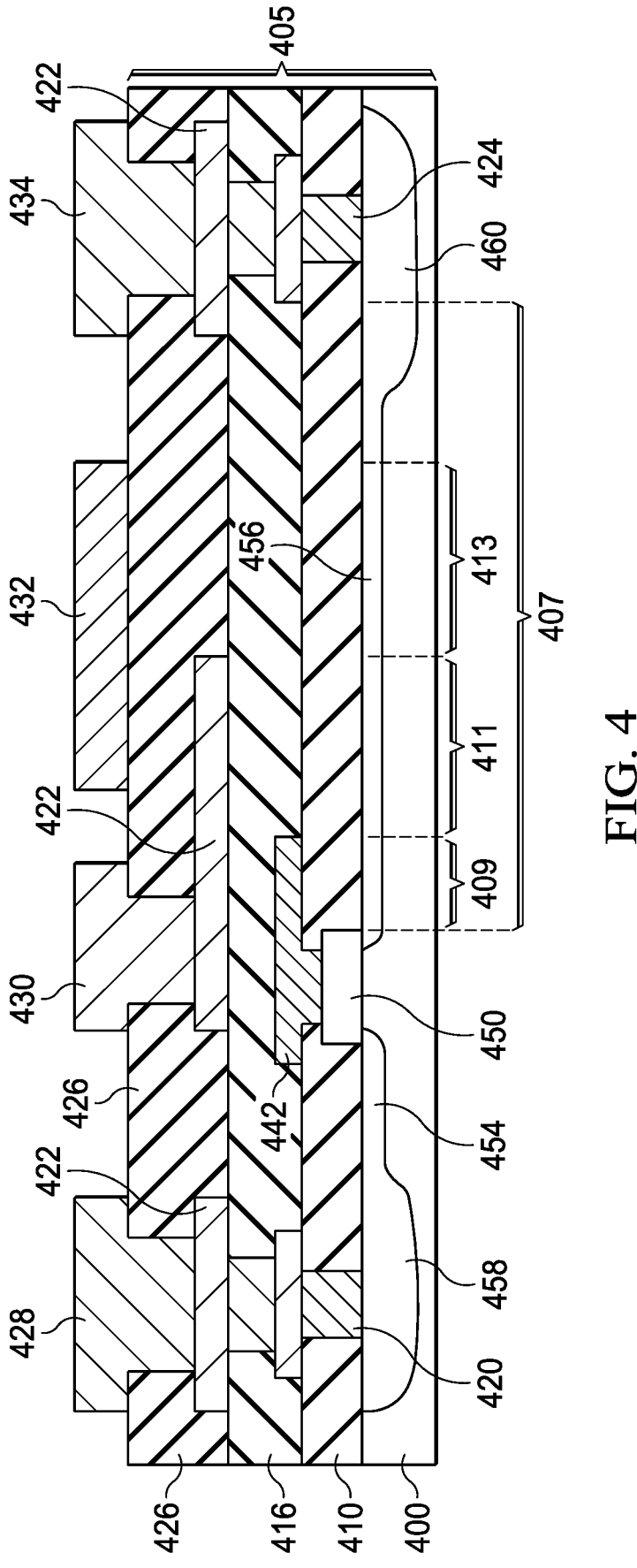
FIG. 4 is a cross sectional view of a high voltage, drain extended MOS transistor (hvDEMOS) with a gate field plate, a first source field plate and a second source field plate with separate probe pads for the transistor source, the first source field plate, and the second source field plate.

FIG. 4 shows a high voltage (hv) drain extended MOS transistor (DEMOS) 405 with first source field plate 422 and second source field plate 432. In FIG. 4 similar reference labels are used for similar elements as are shown in FIG. 2, for clarity. For example, first source field plate 422 in FIG. 4 corresponds to source field plate 222 in FIG. 2. An enhancement mode n-type DEMOS (nDEMOS) transistor is used for illustration, but depletion mode nDEMOS and enhancement or depletion mode p-type DEMOS (pDEMOS) transistors can also be used with the arrangements. The extended drain region 407 in the DEMOS is lightly doped so that it will be depleted of carriers when a high voltage is applied to the drain. A voltage drop occurs across the extended drain depletion region between the drain and the gate.

The substrate 400 of this example nDEMOS device is p-type doped single crystal silicon. A gate 450 over the channel between the source contact 420 and drain contact 424 forms the enhancement mode nDEMOS transistor. The extended drain region 407 including extended drain diffusion 456 between the gate 450 and drain diffusion 460 is of sufficient length to drop enough voltage between the high voltage applied to the drain contact 424 and the gate 450 to enable the use of a low voltage transistor gate dielectric. For example, a voltage of hundreds of volts can be applied to the drain contact and the extended drain diffusion 456 can be designed to drop sufficient voltage to enable a transistor with a gate dielectric having a gate voltage of 5 volts or less to be used.

Pre-metal dielectric (PMD) layer 410 covers a portion of the substrate 400 and the DEMOS gate 450. A gate field plate 442 is formed over the PMD layer 410. The gate field plate 442 can be formed using a first layer of interconnect. A via that extends through the PMD layer 410 couples the gate field plate 442 to the gate 450. The gate field plate 442 covers a first extended drain portion 409 of the extended drain diffusion 456 next to the gate 450. IMD1 layer 416 covers the PMD layer 410 and covers the gate field plate 442. A first source field plate 422, formed on IMD1 layer 416, covers a second extended drain portion 411 of the extended drain 456 adjacent to the end of the gate field plate 442. The first source field plate 422 can be formed using a second layer of interconnect. IMD2 layer 426 covers the IMD1 layer 416 and covers the first source field plate 422. A second source field plate 432, over the IMD2 layer 426, partially covers a third portion extended drain region 413 of the extended drain 456 between the end of the first source field plate 422 and the high voltage drain contact 424. The second source field plate 432 can be formed using a third layer of conductive interconnect. A source probe pad 428 on IMD2 layer 426 is connected to the transistor source diffusion 458 with a stack of vias that extend through the dielectric stack formed by IMD2 layer 426/IMD1 layer 416/PMD layer 410. A drain probe pad 434 on IMD2 layer 426 is connected to the high voltage drain diffusion 460 with a stack of vias through dielectric stack IMD2 layer 426/IMD1 layer 416/PMD layer 410. A first source field plate probe pad 430 on IMD2 layer 426 is connected to the first source field plate 422 with a via that extends through IMD2 layer 426. The second field plate 432 on IMD2 layer 426 can be probed directly and functions as the second field plate probe pad. Individual control of the voltages on the source 420, the first source field plate 422, and the second source field plate 432 provided by applying voltages to the individual probe pads source probe pad 428, first source field plate 430, and second source field plate 432 allows the PMD layer 410 under the gate field plate 442, the dielectric stack (IMD1 layer 416/PMD layer 410), and the dielectric stack (IMD2 layer 426,/IMD1 layer 416/PMD layer 410) to be individually stressed at wafer probe test. The individual control of the voltages on these source field plates and the source contact enables detection of defects in each of these dielectric stacks at wafer probe test, detection of these defects would not be possible without the use of the arrangements.

During normal operation the source probe pad 428, the source field plate probe pad 430, and second source field plate 432 are coupled. Following the testing for defects in the various dielectric stacks at probe, the source field plate probe pad 430, the source field plate 432, and source probe pad 428 can be either coupled together while the dies are still in wafer form, or can be coupled together after dicing and during packaging, as is further described hereinbelow.

Figures 5, 6A:
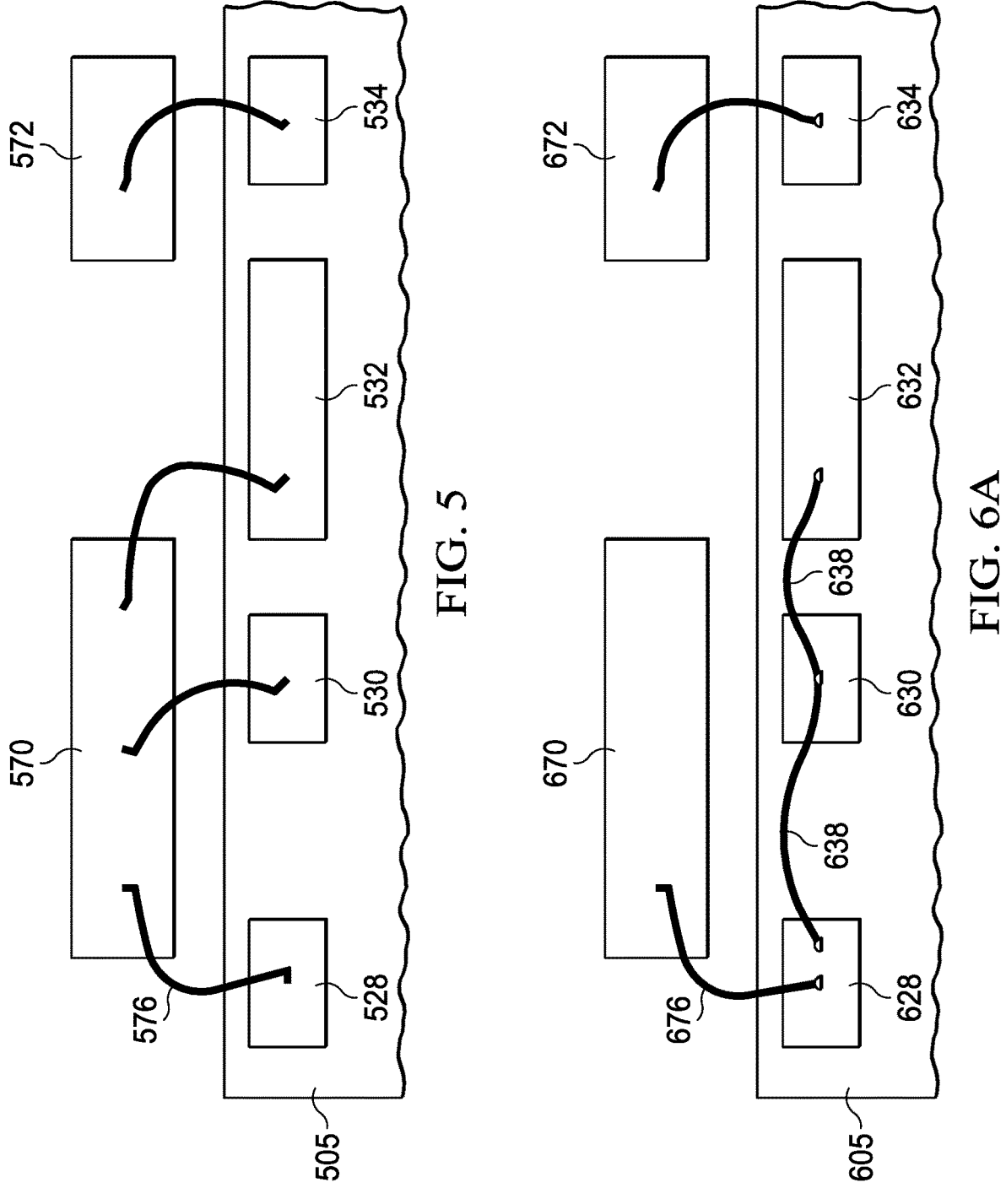
FIG. 5 is a plan view of a corner of a die with a high voltage, extended drain transistor with the transistor source and with the first and second source field plate probe pads wire bonded to a first lead on a lead frame and with the transistor drain probe pad wire bonded to a second lead.
FIG. 6A is a plan view and FIG. 6B is a cross sectional view, respectively, of a die with a high voltage, extended drain transistor.

FIG. 5 illustrates in a partial plan view a source probe pad 528, the first source field plate probe pad 530 and the second source field plate 532 of an arrangement high voltage transistor semiconductor die 536 coupled to a same lead frame lead 570 with wire bonds 576. In FIG. 5 similar reference labels are used for similar elements as are shown in FIG. 1. For example, source probe pad 528 in FIG. 5 corresponds to source probe pad 128 in FIG. 1. The high voltage drain probe pad 534 is coupled to a separate lead frame lead 572 with a wire bond 576.

Figure 6B:
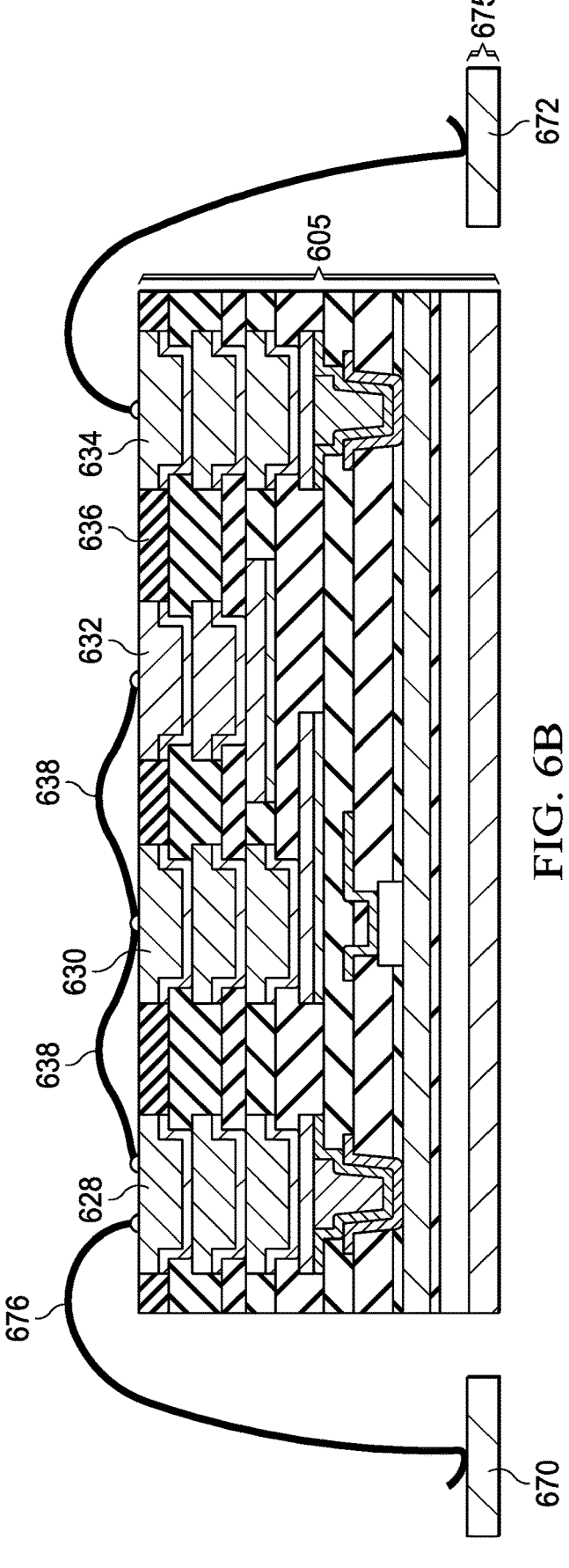

FIGS. 6A and 6B are a plan view and a cross sectional view, respectively, of an arrangement high voltage semiconductor device 636 with a source probe pad 628, a first source field plate probe pad 630 and a second source field plate probe pad 632 coupled together with stitch bonds 638. The stitch bonds 638 can be formed prior to dicing or post dicing. In FIGS. 6A and 6B similar reference labels are used for similar elements as are shown in FIG. 1. For example, source probe pad 628 in FIGS. 6A and 6B corresponds to source probe pad 128 in FIG. 1. After the high voltage transistor device 636 is mounted on the lead frame 675 (in FIG. 6B), the source probe pad 628 and the high voltage drain probe pad 634 are coupled to lead frame leads 670 and 672 with wire bonds 676. A polyimide protective overcoat layer 636 is shown formed over portions of device 605.

Figure 7A:
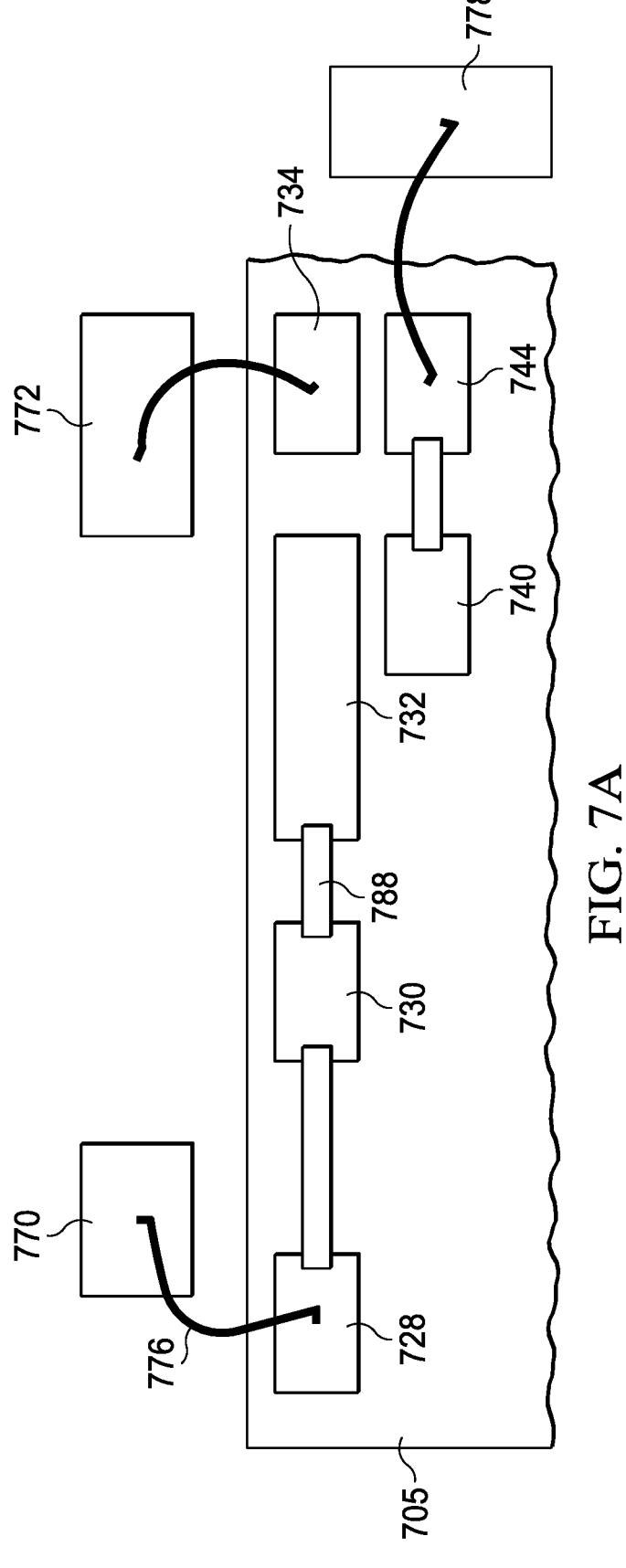
FIG. 7A is a plan view and FIG. 7B is a cross sectional view, respectively, of a die with a high voltage, extended drain transistor with the transistor source and the first and second source field plate probe pads coupled together.
Figure 7B:
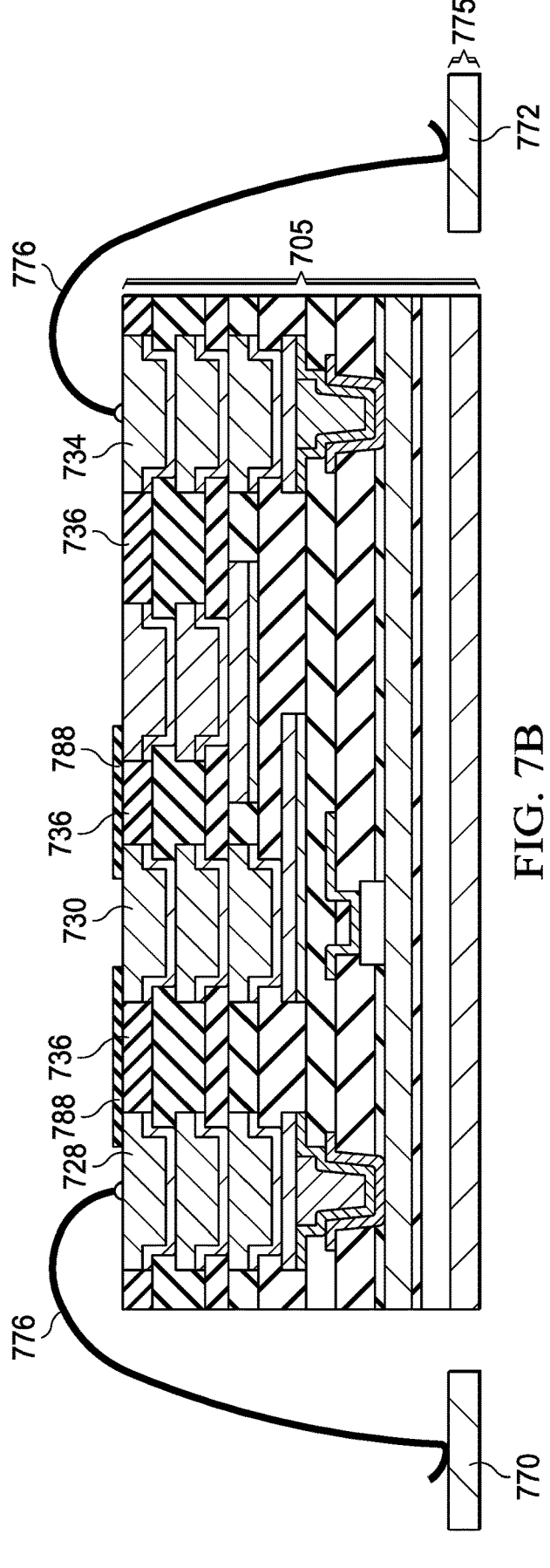

FIGS. 7A and 7B are a partial plan view and a cross sectional view, respectively, of another arrangement high voltage transistor device 705. Device 705 is shown with a source probe pad 728, a first source field plate probe pad 730 and a second source field plate probe pad 732 coupled together by shorting bars 788. A shorting bar is shown coupling the gate field plate probe pad 740 and the gate probe pad 744 (See FIG. 3B). In FIGS. 7A and 7B similar reference labels are used for similar elements as are shown in FIGS. 6A and 6B. For example, source probe pad 728 in FIGS. 7A and 7B corresponds to source probe pad 628 in FIGS. 6A and 6B. The shorting bars 788 can be added after final test in wafer form using standard interconnect photolithographic deposition, patterning, and etching processes. In an alternative the shorting bars can be added in either wafer form or post dicing using ink-jet deposition of a conductive ink. In this arrangement the source probe pad 728, the drain probe pad 734, and the gate probe pad 744 are coupled to lead frame leads 770, 772, and 778, respectively of a lead frame 775 using wire bonds 776. Shorting bars 788 are shown overlying the protective overcoat layer 736 that overlies the device 705 between the probe pads.

Figures 8A, 8B:
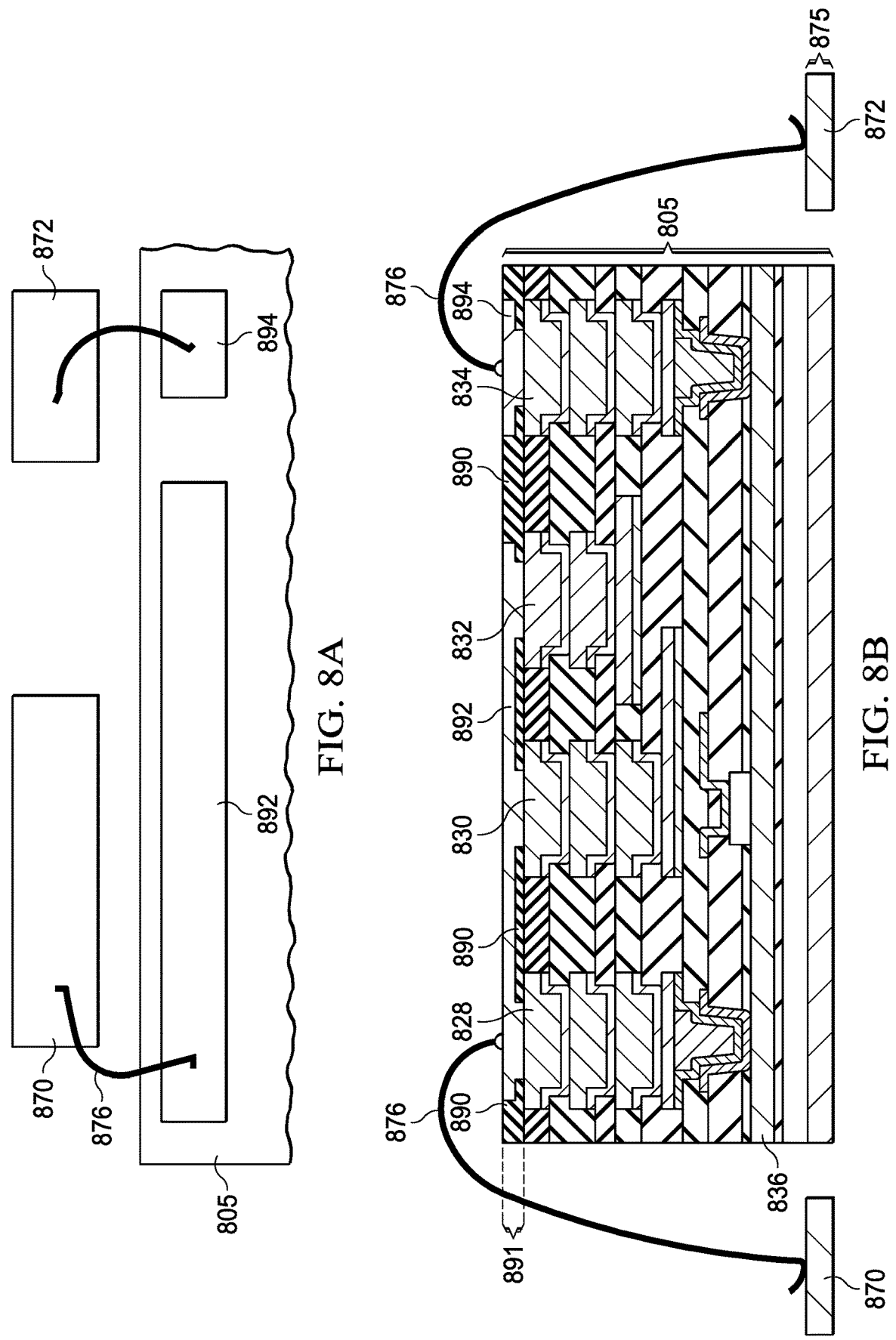
FIG. 8A is a plan view and FIG. 8B is a cross sectional view, respectively, of a die with a high voltage, extended drain transistor with the transistor source probe pad and the first and second source field plate probe pads coupled together with a redistribution layer.

FIGS. 8A and 8B are a plan view and a cross sectional view, respectively, of a source probe pad 828, a first source field plate probe pad 830 and a second source field plate probe pad 832 coupled together using a conductive redistribution layer 891. In FIGS. 8A and 8B similar reference labels are used for similar elements as are shown in FIGS. 6A and 6B. For example, source probe pad 828 in FIGS. 8A and 8B corresponds to source probe pad 628 in FIGS. 6A and 6B. After final probe test, a dielectric layer 890 such as polyimide is deposited covering the probe pads 828, 830, 832 and 834 and IMD2 layer 836. A redistribution layer of a conductive material 891 is deposited on the dielectric layer 890 and is patterned to form a source bond pad 892 and drain bond pad 894. Vias that extend through the dielectric layer 890 couple the source probe pad 828, the first source field plate probe pad 830, and the second source field plate probe pad 832 to the source bond pad 892. The drain probe pad 834 is coupled to the drain bond pad 894 with a via through dielectric layer 890. The source bond pad 892 and the drain bond pad 894 are connected to lead frame leads 870 and 872 on lead frame 875 with wire bonds 876.

Figures 9A, 9B:
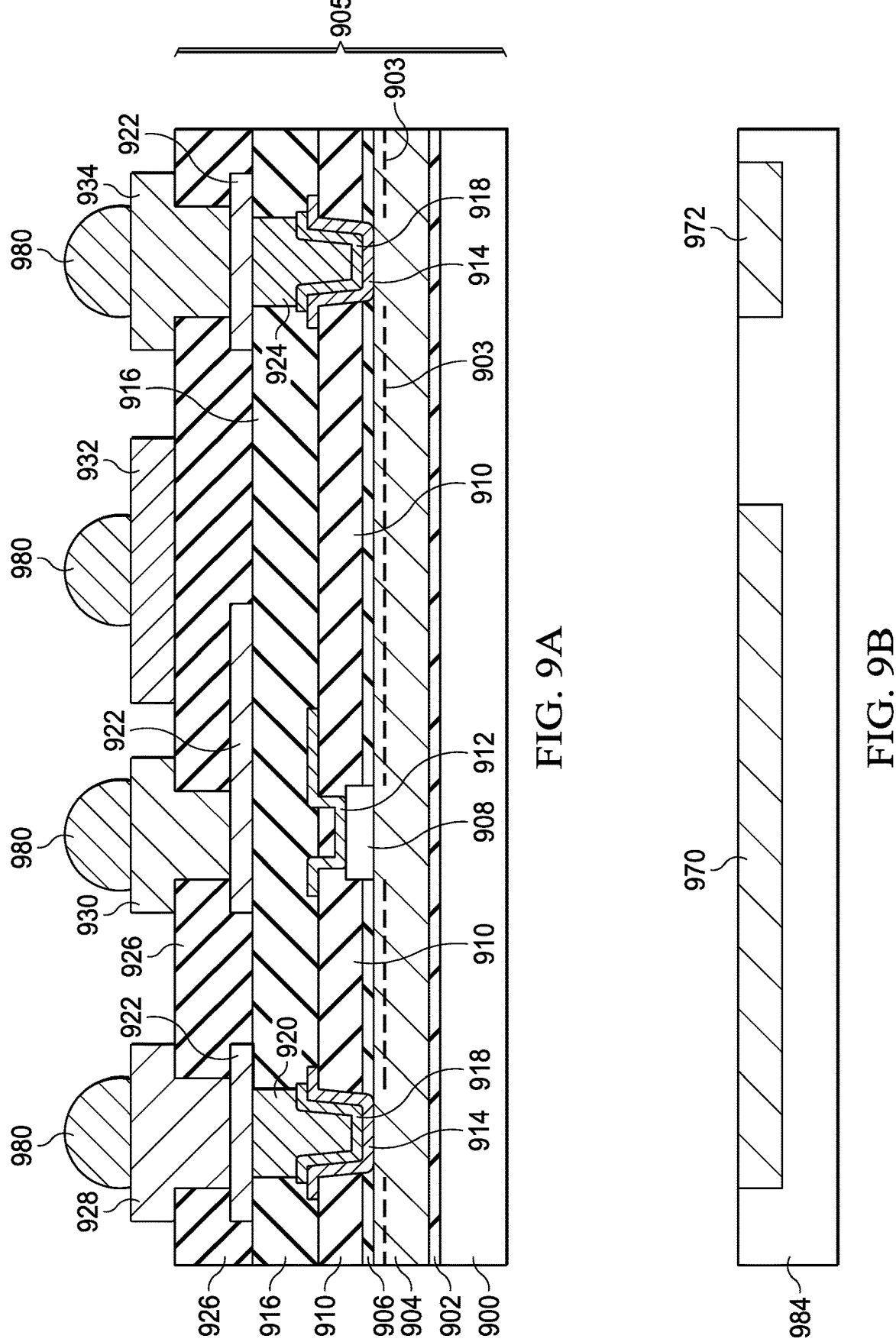
FIGS. 9A, 9B, 9C, and 9D are cross sectional views illustrating an arrangement with a transistor source probe pad, a first source field plate probe pad, and a second source field plate probe pad coupled to the same lead on a substrate using flip-chip ball bonding.

FIGS. 9A-9D illustrate in cross sectional views another arrangement in which a source probe pad 928, a first source field plate probe pad 930, and a second source field plate probe pad 932 are coupled together when a die is mounted on a substrate. In FIGS. 9A-9D similar reference labels are used for similar elements as are shown in FIGS. 6A and 6B. For example, hv-HEMT 905 in FIGS. 9A-9D corresponds to hv-HEMT 605 in FIGS. 6A and 6B. In FIG. 9A, ball bonds 980 are formed on the source probe pad 928, the first source field plate probe pad 930, the second source field plate probe pad 932, and the high voltage drain probe pad 934.

A substrate 984 with leads 970 and 972 is illustrated in FIG. 9B. The substrate can be a printed circuit board, a lead frame, or any nonconductive substrate with conductive leads. Premolded leadframe (PMLF) and molded interconnect substrate (MIS) substrates can be used. Partially etched leadframes can be used with the arrangements.

Figure 9C:
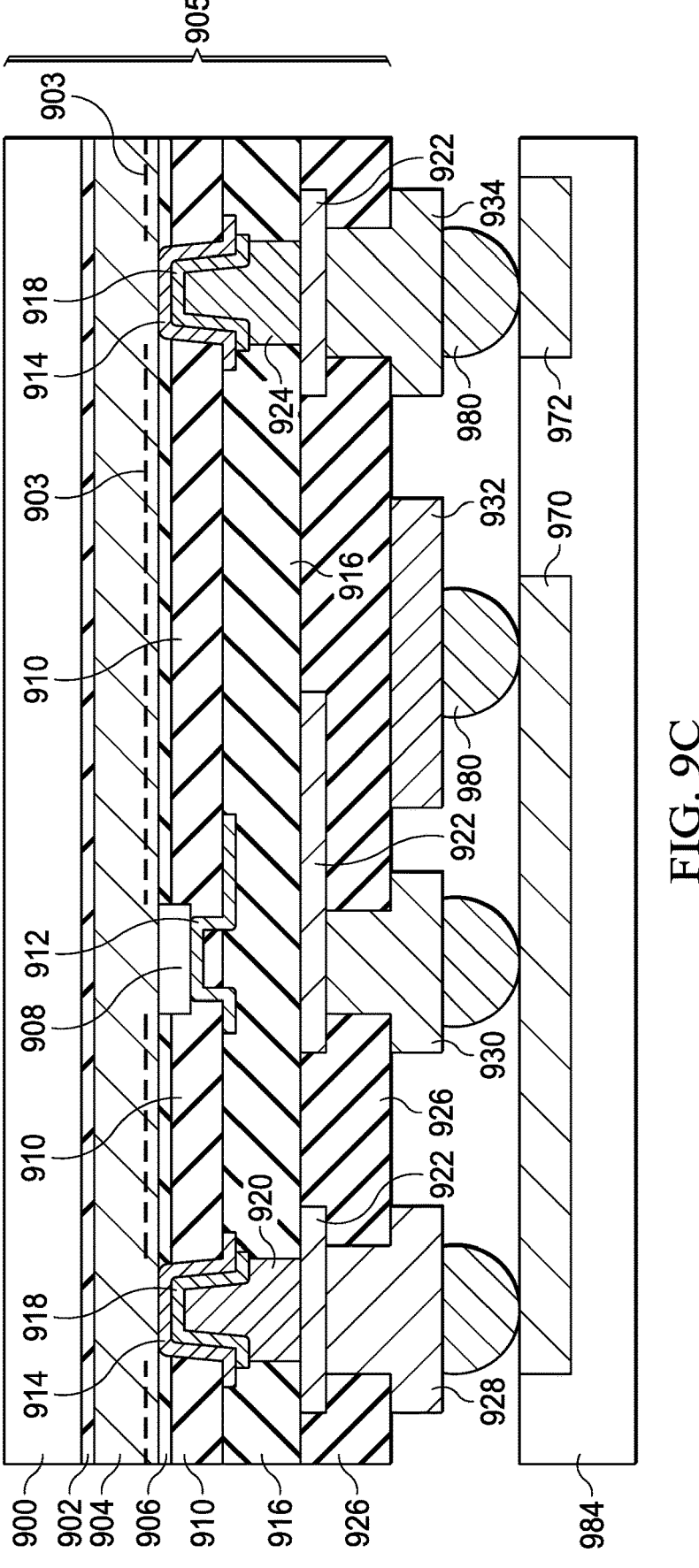
Figure 9D:
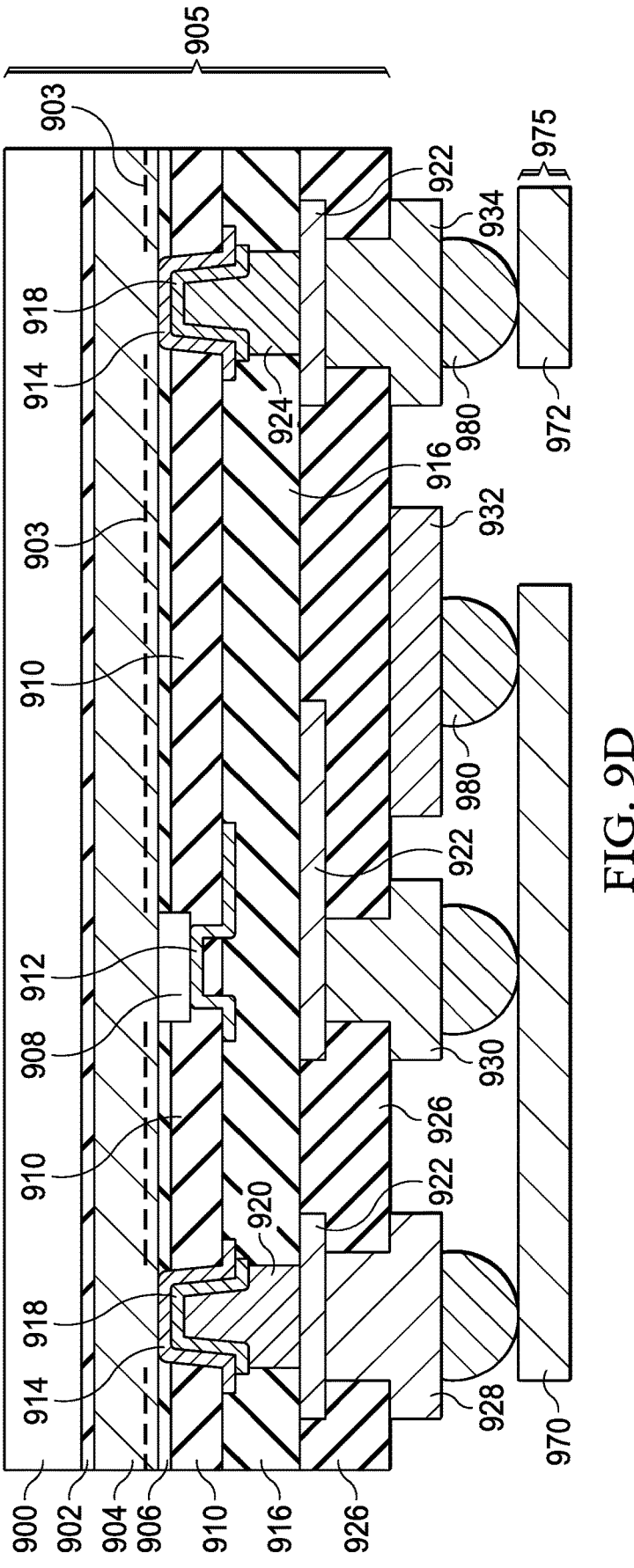

FIG. 9C shows the hv-HEMT 905 flip chip mounted on leads, 970 and 972, on a substrate 984. FIG. 9D shows the hv-HEMT 905 flip chip mounted on a lead frame 975. The ball bonds 980 on the source probe pad 928, the first source field plate probe pad 930, and the second source field plate probe pad 932 are all coupled together by bonding them to the same substrate or lead frame lead 970. A separate ball bond 980 is formed between high voltage drain probe pad 934 and a separate substrate or lead frame lead 972.

FIGS. 10A-10D depict in a series of cross sectional views the major steps for forming a packaged high voltage transistor with individual source field plate probe pads coupled to the source probe pad. The major steps are also described in the flow diagram in FIG. 11. In FIGS. 10A-10D similar reference labels are used for similar elements as are shown in FIG. 1. For example, source probe pad 1028 in FIG. 10A corresponds to source probe pad 128 in FIG. 1.

Figure 10A:
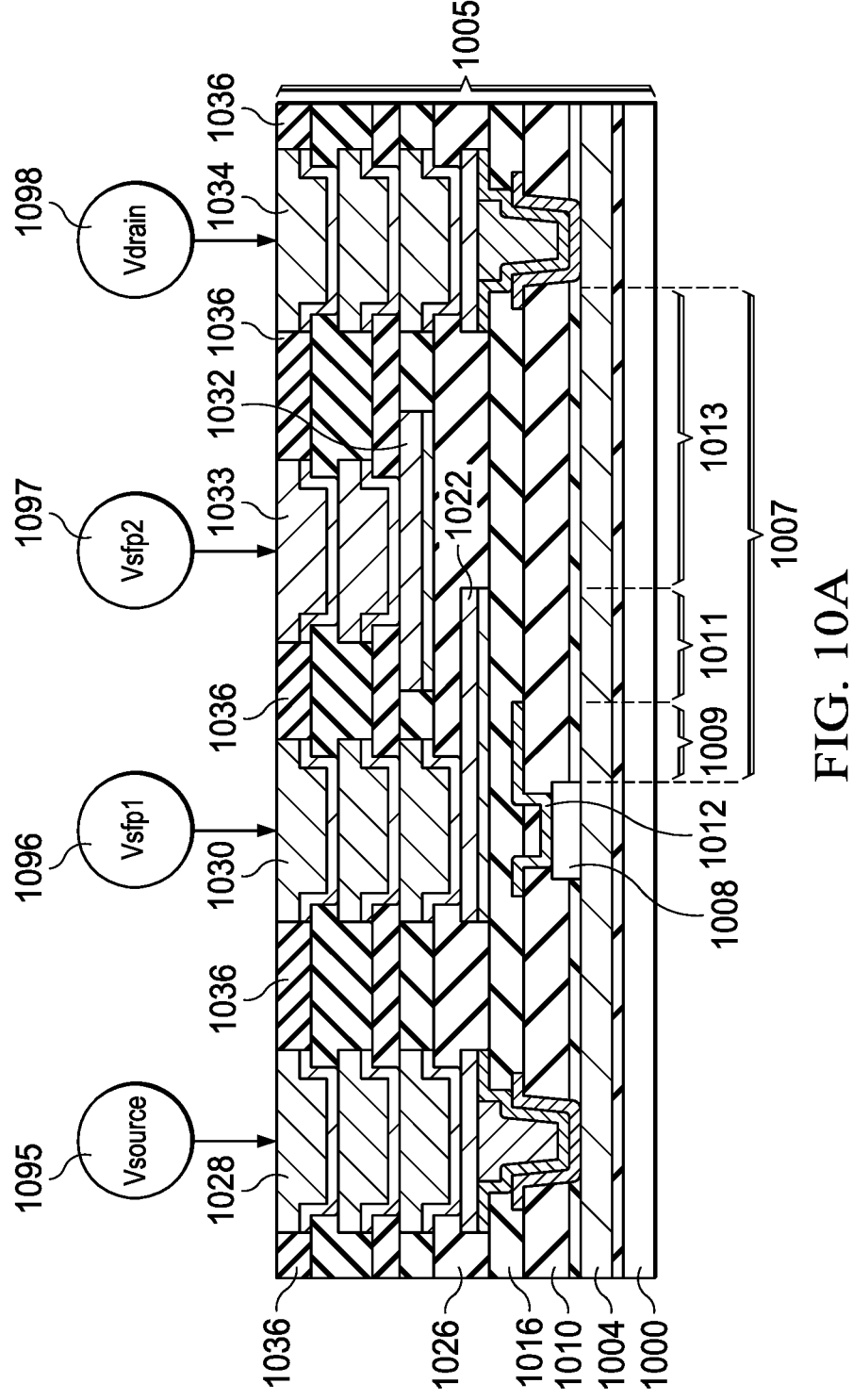
FIGS. 10A, 10B, 10C, and 10D are cross sectional views illustrating the major steps in testing and packaging a high voltage, extended drain transistor with electrically independent source probe pad and source field plate probe pads

In FIG. 10A (steps 1101, 1103, 1105, 1107, 1109 and 1111 in FIG. 11) voltage stress is sequentially applied to the individual dielectric stacks under the second source field plate, the first source field plate and the gate field plate to detect defects in the dielectric stacks. First, in step 1101, the source probe pad 1028 is grounded (see Vsource 1095), the first source field plate probe pad 1030 is grounded (see Vsfp1 1096), the second source field plate probe pad 1033 is grounded (see Vsfp2 1097) and a high voltage is applied to the drain probe pad 1034 (see Vdrain 1098). This applies high voltage stress to the dielectric stack (IMD2 layer 1026/IMD layer 1016/PMD layer 1010) between the second source field plate 1032 and the underlying third portion of the extended drain region (1013). If leakage between the second source field plate probe pad 1033 and the drain probe pad 1034 exceeds specifications, the dielectric stack is defective and the hv-HEMT can be scrapped (Step 1103). Second, in step 1105, the voltage on the source probe pad 1028 remains at ground (see Vsource 1095), the voltage on the second source field probe pad 1033 is raised (see Vsfp2 1097) causing the potential of the portion of the extended drain region under the second source field plate 1032 to rise, applying voltage stress to the dielectric stack (IMD1 layer 1016/PMD layer 1010) between the first source field plate 1022 and the underlying second extended drain region (1011). The voltage at the first source plate probe pad 1030 is at ground (Vsource 1096). If the leakage current between the first source field plate probe pad 1030 and the drain probe pad 1034 exceeds specifications, the dielectric stack (IMD1 layer 1016/PMD layer 1010) is defective and the hv-HEMT may be scrapped (Step 1107). Third, in step 1109, the voltages on the first and second source field plate probe pads, 1030 and 1033, are raised (see 1096, Vspf1 and 1097, Vspf2) causing the potential of the second and third drain regions under the first and second source field plates 1022 and 1032 to rise, applying voltage stress to the PMD 1010 under the gate field plate 1012. If the leakage current between the gate field plate 1012 and the drain probe pad 1034 exceeds specifications, the PMD layer 1010 is defective and the hv-HEMT may be scrapped (Step 1111). In this manner, by use of the arrangements, the dielectric stacks under each of the field plates including second source field plate 1032, first source field plate 1022, and gate field plate 1012 can advantageously be individually stressed and defective dielectric stacks can be detected. The stress test is illustrated with two source field plates, 1022 and 1032. One source field plate or more than two source field plates can also be used. In using the arrangements, dielectric defects can be detected at wafer probe test, whereas in prior approaches, the dielectric defects were only detected after packaging was complete.

Figure 10B:
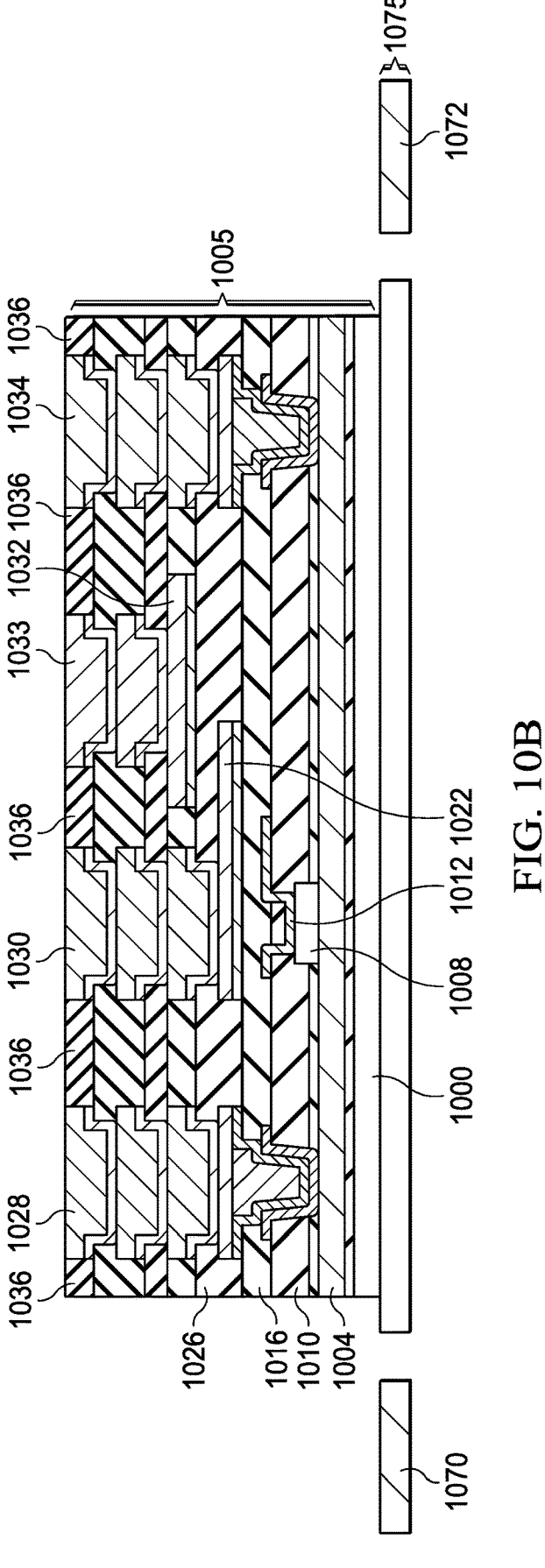

In FIG. 10B (step 1113, FIG. 11) the high voltage transistor die 1005 is mounted on a substrate. A lead frame 1075 substrate is used for illustration.

Figure 10C:
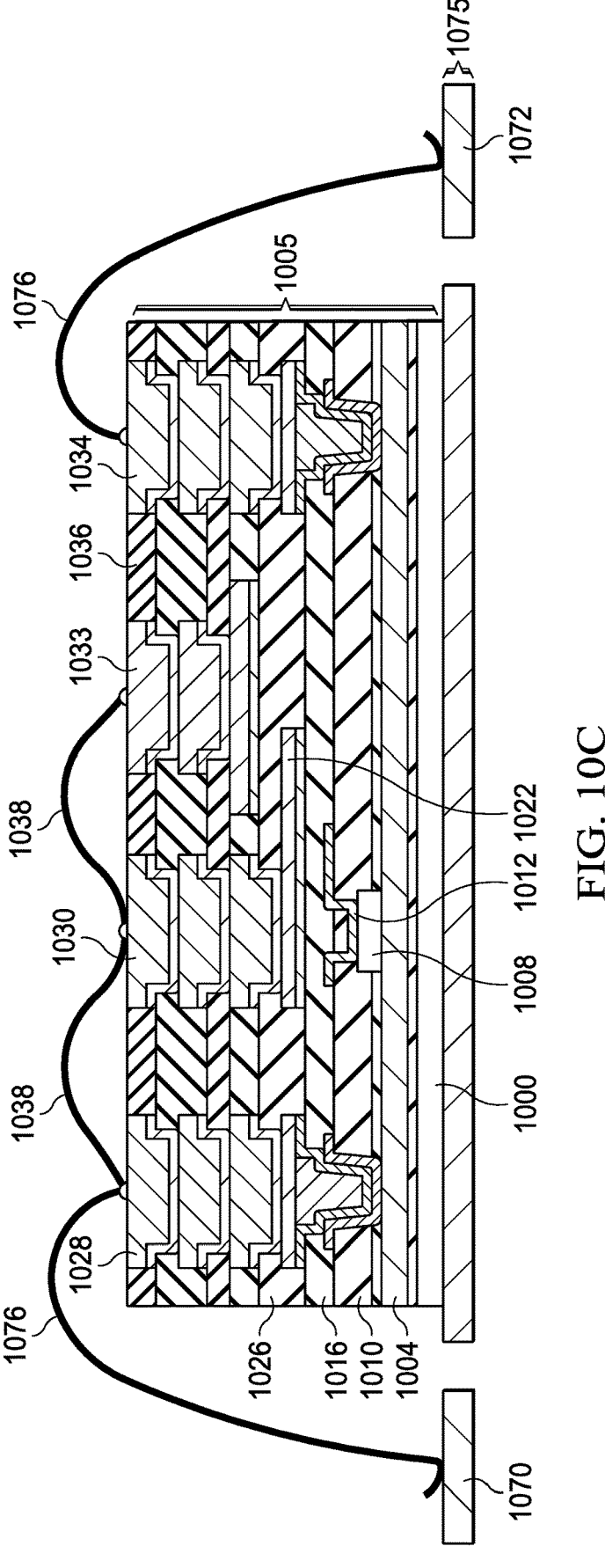

In FIG. 10C (step 1115, FIG. 11) wire bonding is used to form stitch bonds 1038 that couple first source field plate probe pad 1030 and second source field plate probe pad 1033 together and to the source probe pad 1028. The wire bonding also forms a wire bond (step 1117, FIG. 11) between the source probe pad 1028 and lead frame lead 1072 of lead frame 1075 and between the drain probe pad 1034 and lead frame lead 1074. Alternatively, other methods of connecting the source field plate probe pads to the source probe pad such as are described in FIGS. 5, 6, 7, 8 and 9 can be used.

Figure 10D:
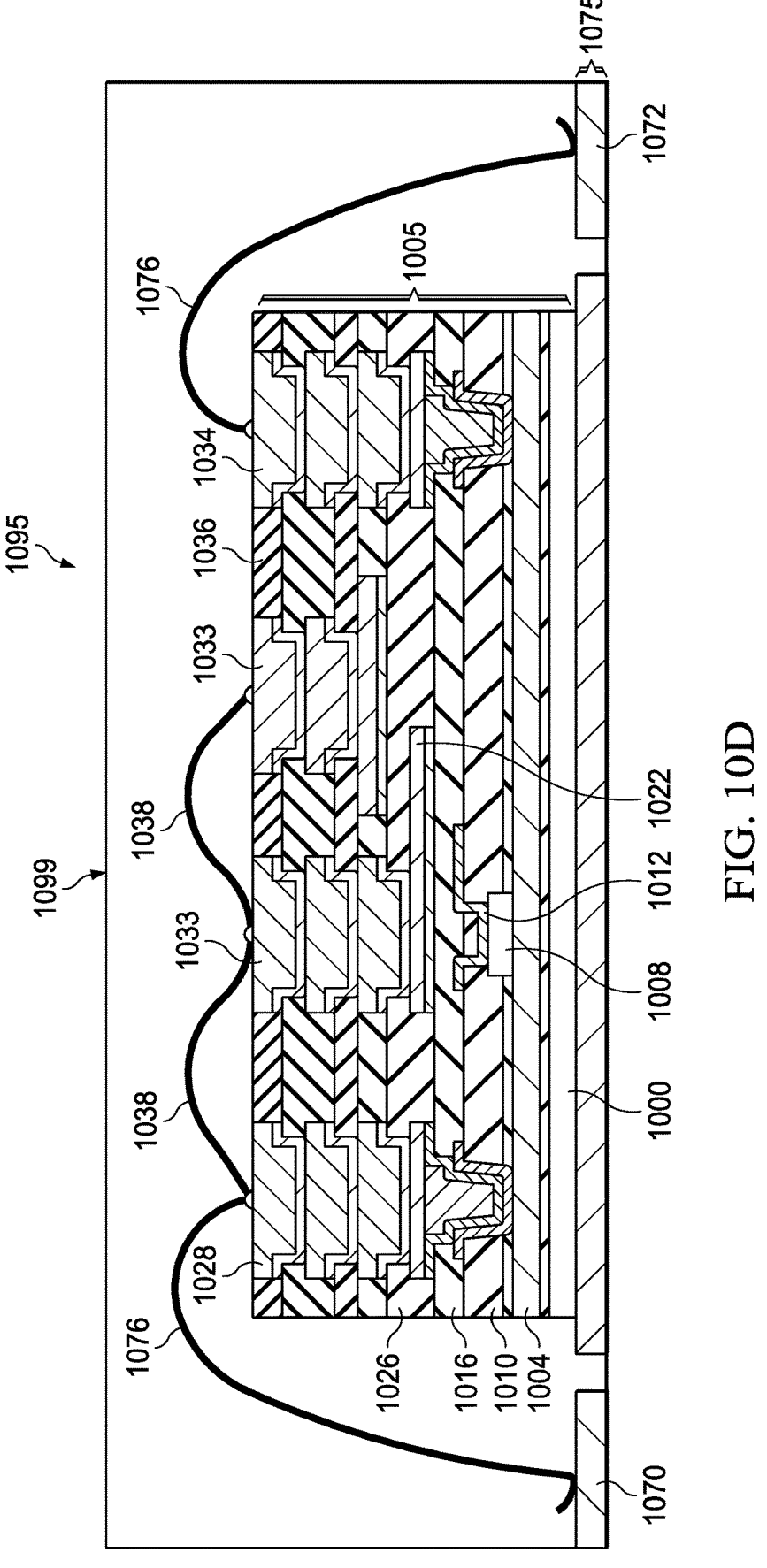

FIG. 10D (step 1119, FIG. 11) shows the packaged high voltage transistor with first source field plate probe pad 1030 and second source field plate probe pad 1033 coupled to the source probe pad 1028. The high voltage transistor 1005, the wire bonds 1076 and a portion of the lead frame 1075 are partially encased in molding compound 1099 to form the packaged high voltage transistor 1095.

Modifications are possible in the described arrangements, and other alternative arrangements are possible within the scope of the claims.

What is claimed is:

1. An apparatus, comprising:
a transistor formed on a semiconductor substrate, the transistor comprising:
   a transistor gate and an extended drain between the transistor gate and a transistor drain contact;
   a transistor source contact coupled to a source contact probe pad;
   a first dielectric layer covering the semiconductor substrate and the transistor gate;
   a source field plate on the first dielectric layer and coupled to a source field plate probe pad spaced from and electrically isolated from the source contact probe pad; and
   the source field plate capacitively coupled through the first dielectric layer to a first portion of the extended drain.

2. The apparatus of claim 1, wherein the first dielectric layer comprises a first inter-metal dielectric layer/pre-metal dielectric layer dielectric stack.

3. The apparatus of claim 2, the transistor further comprising:
   a gate field plate over the pre-metal dielectric layer; and
   the gate field plate capacitively coupled through the pre-metal dielectric layer to a second portion of the extended drain that is between the transistor gate and the first portion of the extended drain.

4. An apparatus, comprising:
a transistor formed on a semiconductor substrate, the transistor comprising:
   a transistor gate and an extended drain between the transistor gate and a transistor drain contact;
   a transistor source contact coupled to a source contact probe pad;
   a first inter-metal dielectric layer/pre-metal dielectric layer dielectric stack covering the semiconductor substrate and the transistor gate;
   a source field plate on the first inter-metal dielectric layer/pre-metal dielectric layer dielectric stack and coupled to a source field plate probe pad spaced from and electrically isolated from the source contact probe pad;
   the source field plate capacitively coupled through the first inter-metal dielectric layer/pre-metal dielectric layer dielectric stack to a first portion of the extended drain;
   a gate field plate over the first inter-metal dielectric layer/pre-metal dielectric layer dielectric stack;
   the gate field plate capacitively coupled through the first inter-metal dielectric layer/pre-metal dielectric layer dielectric stack to a second portion of the extended drain that is between the transistor gate and the first portion of the extended drain; and
   wherein the gate field plate couples to the transistor gate in an opening through the pre-metal dielectric layer.

5. The apparatus of claim 3, wherein the gate field plate is coupled to a gate field plate probe pad, and the transistor gate is coupled to a gate probe pad.

6. The apparatus of claim 1, wherein the transistor comprises a gallium nitride (GaN) transistor.

7. The apparatus of claim 1, wherein the transistor comprises a gallium oxide ($Ga_2O_3$) transistor.

8. An apparatus, comprising:
a silicon drain extended metal oxide semiconductor (DEMOS) transistor formed on a semiconductor substrate, the transistor comprising:
   a transistor gate and an extended drain between the transistor gate and a transistor drain contact;
   a transistor source contact coupled to a source contact probe pad;
   a first dielectric layer covering the semiconductor substrate and the transistor gate;
   a source field plate on the first dielectric layer and coupled to a source field plate probe pad spaced from and electrically isolated from the source contact probe pad; and
   the source field plate capacitively coupled through the first dielectric layer to a first portion of the extended drain.

9. An apparatus, comprising:
a transistor formed on a semiconductor substrate, the transistor comprising:
   a transistor gate and an extended drain between the transistor gate and a transistor drain contact;
   a transistor source contact coupled to a source contact probe pad;
   a first dielectric layer covering the semiconductor substrate and the transistor gate;
   a source field plate on the first dielectric layer and coupled to a source field plate probe pad spaced from and electrically isolated from the source contact probe pad;
   the source field plate capacitively coupled through the first dielectric layer to a first portion of the extended drain; and
   wherein the source field plate of the transistor further comprises:
      a first source field plate capacitively coupled through a first inter-metallic dielectric layer/pre-metal dielectric layer dielectric stack to the first portion of the extended drain adjacent to the transistor gate;
      the first source field plate coupled to a first source field plate probe pad;
      a second source field plate capacitively coupled through a second inter-metal dielectric layer/first inter-metal dielectric layer/pre-metal dielectric layer dielectric stack to a third portion of the extended drain between the first portion of the extended drain and the transistor drain contact; and the second source field plate coupled to a second source field plate probe pad.

10. The apparatus of claim 9, the transistor further comprising:

a gate field plate over the pre-metal dielectric layer, the gate field plate capacitively coupled to a second portion of the extended drain through the pre-metal dielectric layer, the second portion of the extended drain located between the gate and the first portion of the extended drain.

11. The apparatus of claim 10, wherein the gate field plate is coupled to the transistor gate in an opening through the pre-metal dielectric layer.

12. The apparatus of claim 10, wherein the gate field plate is coupled to a gate field plate probe pad and the transistor gate is coupled to a gate probe pad that is spaced from and electrically isolated from the gate field probe pad.

13. An apparatus, comprising:

a transistor formed on a semiconductor substrate having a transistor gate and an extended drain between the transistor gate and a transistor drain contact, the transistor further comprising:

a transistor source contact;

a pre-metal dielectric layer covering a portion of the semiconductor substrate and the transistor gate;

a gate field plate over the pre-metal dielectric layer and overlying a portion of the transistor gate and capacitively coupled through the pre-metal dielectric layer to a first portion of the extended drain adjacent to the transistor gate;

a first inter-metal dielectric layer covering the pre-metal dielectric layer and the gate field plate;

a source field plate over the first inter-metal dielectric layer;

the source field plate overlying an end of the gate field plate and overlying a second portion of the extended drain between the first portion of the extended drain and the transistor drain contact;

the source field plate capacitively coupled to the second portion of the extended drain through a dielectric stack of the first inter-metal dielectric layer/pre-metal dielectric layer;

the transistor source contact coupled to a transistor source probe pad; and the source field plate coupled to a source field plate probe pad.

14. The apparatus of claim 13, wherein the source field plate of the transistor is a first source field plate and further comprising:

a second inter-metal dielectric layer covering the first inter-metal dielectric layer and the first source field plate; and a second source field plate over the second inter-metal dielectric layer and coupled through a dielectric stack of the second inter-metal dielectric layer/first inter-metal dielectric layer/pre-metal dielectric layer to a third portion of the extended drain between the second portion of the extended drain and the drain contact.

15. An apparatus, comprising:

a transistor formed on a semiconductor substrate, the transistor comprising:

a transistor gate and an extended drain between the transistor gate and a transistor drain contact;

a transistor source contact coupled to a source contact probe pad;

a first dielectric layer covering the semiconductor substrate and the transistor gate;

a source field plate on the first dielectric layer and coupled to a source field plate probe pad spaced from and electrically isolated from the source contact probe pad;

the source field plate capacitively coupled through the first dielectric layer to a first portion of the extended drain; and a mold compound covering a portion of the transistor including the extended drain and the substrate.

16. The apparatus of claim 15, wherein the mold compound covering a portion of the transistor including the extended drain and the substrate forms a packaged extended drain transistor.

17. The apparatus of claim 1, wherein the semiconductor substrate is one of a printed circuit board, a lead frame, or any nonconductive substrate with conductive leads.

18. The apparatus of claim 13, further including a mold compound covering a portion of the transistor including the extended drain and the substrate.

19. The apparatus of claim 18, wherein the mold compound covering a portion of the transistor including the extended drain and the substrate forms a packaged extended drain transistor.

20. The apparatus of claim 13, wherein the semiconductor substrate is one of a printed circuit board, a lead frame, or any nonconductive substrate with conductive leads.

* * * * *